United States Patent [19]

Yamanouchi et al.

[11] Patent Number: 4,987,384
[45] Date of Patent: Jan. 22, 1991

[54] HIGH FREQUENCY AMPLIFIER

[75] Inventors: Masahide Yamanouchi; Tetsuro Mori, both of Itami, Japan

[73] Assignee: Mitsubishi Denki Kabushiki Kaisha, Japan

[21] Appl. No.: 415,610

[22] Filed: Oct. 2, 1989

[30] Foreign Application Priority Data

Oct. 7, 1988 [JP] Japan .................................. 63-254346

[51] Int. Cl.$^5$ .............................................. H03F 3/16
[52] U.S. Cl. ...................................... 330/286; 330/277
[58] Field of Search .............. 330/277, 286, 290, 291, 330/296; 333/116, 128, 161, 204

[56] References Cited

U.S. PATENT DOCUMENTS 3,965,445 6/1976 Ou ...................................... 333/116 X
4,504,796 3/1985 Igarashi .............................. 330/277 C

FOREIGN PATENT DOCUMENTS 0657587 4/1979 U.S.S.R. ............................... 330/286

Primary Examiner—Steven Mottola

[57] ABSTRACT

A high frequency amplifier including a field effect transistor as the amplifying element, includes an output detection section stripline for detecting the level of the output signal from the field effect transistor conducting main amplification, a pair of resistors connected between the both ends of the output detection section stripline and ground, a second field effect transistor to the gate of which a resistor from one end of the output detection section stripline is connected, the source or drain of the second field effect transistor being connected to the gate bias circuit of the main amplifying FET for controlling the drain current of the main amplifying FET in response to the output signal level of the main amplifying FET.

9 Claims, 3 Drawing Sheets

AT A LOW INPUT
SIGNAL LEVEL

HIGH FREQUENCY AMPLIFIER

FIELD OF THE INVENTION

The present invention relates to a high frequency amplifier and, more particularly, to an amplifier utilizing a field effect transistor for high efficiency in operation.

BACKGROUND OF THE INVENTION

FIG. 3 shows a portion of a prior art high frequency amplifier utilizing a GaAs field effect transistor (hereinafter referred to as GaAs FET). In FIG. 3, as signal terminals, there are provided an input terminal 1, an output terminal 2, a drain bias terminal 3, and a gate bias terminal 4. As striplines, there are provided an input section stripline 10, an output section stripline 8, and a gate bias stripline 6. An output matching condenser 9 is provided at the other end of the output section stripline 8. A GaAs FET 14 is a main amplification FET. A first, second, and third gate bias resistor 11, 12, and 13 constitute a gate bias circuit of the main amplification FET 14.

The respective circuit elements are connected as shown in FIG. 3 and this circuit is a high frequency amplifier operating as follows.

A drain voltage is applied to the GaAs FET 14 from the drain bias terminal 3 through the drain bias stripline 7, and a gate bias voltage is applied to the GaAs FET 14 from the gate bias terminal 4 through the gate bias resistors 11, 12, and 13 and the gate bias stripline 6. In this state, when a high frequency signal is input to the input terminal 1 of the amplifier, a signal amplified by the amplifier is supplied to the output terminal 2.

FIG. 4 shows an input/output (input power vs. output power) characteristic for the operation of this high frequency amplifier. The abscissa represents input signal level $P_{in}$, the left ordinate represents output signal level $P_{out}$, the right ordinate represents power addition efficiency $\eta_{add}$ and the drain current $I_D$. The solid line in the graph represents the input signal level $P_{in}$ vs. output signal level $P_{out}$ characteristic, the dotted line represents the input signal level $P_{in}$ vs. power addition efficiency $\eta_{add}$ characteristic, and the dot-dash line represents the input signal level $P_{in}$ vs. drain current $I_D$ characteristic, respectively, of the FET 14. Furthermore, $$\eta_{add} = \frac{(P_{out} - P_{in})}{V_D \times I_D} \quad (1)$$

(herein, $V_D$ represents the source to drain voltage).

In the prior art high frequency amplifier of such construction, when the input signal level $P_{in}$ is low in A-class amplification operation, the efficiency $\eta_{add}$ is unfavourably lowered. That is, the linear gain $G_{LP}$ is represented by $$G_{LP} = \frac{P_{out}}{P_{in}},$$

and the above described formula (1) can be rewritten as the following:

$$\eta_{add} = \frac{P_{in}(G_{LP} - 1)}{V_D \times I_D} \quad (1)'$$

Because the gate bias voltage is constant, the drain current $I_D$ and drain voltage $V_D$ take approximately constant values. Further, the gain $G_{LP}$ takes a constant value. Therefore, the above described formula (1)' is represented by $$\eta_{add} \approx k' \cdot P_{in}$$

(herein, k' is a constant, and $V_D$ and $I_D$ are constants). As shown in FIG. 5, the power added efficiency $\eta_{add}$ is proportional to the input signal level $P_{in}$. Accordingly, in case where the input level $P_{in}$ is low, idle DC power does not contribute to the high frequency and is dissipated, thereby lowering operating efficiency.

SUMMARY OF THE INVENTION

An object of the present invention is to provide a high frequency amplifier capable of achieving high efficiency in operation even at a low input signal level.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, an output detection section for detecting the output signal level of the main amplification FET is provided comprising an output detection section stripline arranged in parallel with the output section stripline, resistors connected between the ends of the output detection section stripline and ground, respectively, and a diode connected in series with one of the resistors. Further, a second field effect transistor whose gate is connected to the detection output of the output detection section is connected in the gate bias circuit of the main amplification FET, thereby making variable the gate bias voltage of the main amplification FET and depending on the output signal level. Accordingly, as the output signal level is reduced, the drain current of the second FET increases, and accompanying therewith the gate bias of the first FET is decreased, thereby reducing the source to drain current and enhancing the operational efficiency at low input signal levels.

DETAILED DESCRIPTION OF THE PREFERRED EMBODIMENTS

An embodiment of the present invention will be described in detail with reference to the drawings.

Figure 1:
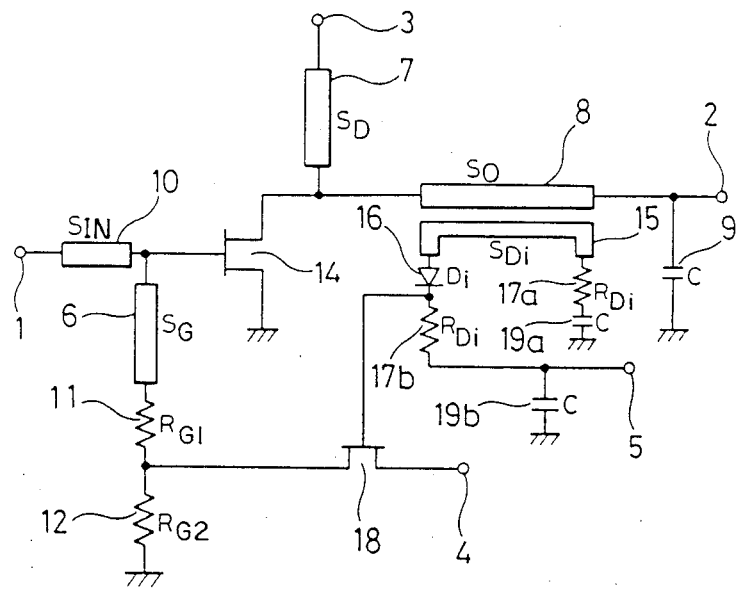
FIG. 1 is a diagram showing a high frequency amplifier according to an embodiment of the present invention.

FIG. 1 shows a high frequency amplifier according to an embodiment of the present invention. In FIG. 1, as signal terminals, there are provided an input terminal 1, an output terminal 2, a drain bias terminal 3, a gate bias terminal 4, and a detection section bias terminal 5. As striplines, there are provided an input section stripline $S_{IN}$ 10, an output section stripline $S_O$ 8, a gate bias stripline $S_G$ 6, a drain bias stripline $S_D$ 7, and an output detection section stripline $S_{Di}$ 15. A first GaAs FET (FET1) 14 is a main amplification FET. A matching capacitor 9 is connected between the end of the output section stripline 8 connected to output terminal 2 and ground. A first gate bias resistor $R_{G1}$ 11 and a second gate bias resistor $R_{G2}$ 12 are connected in series with each other and from the gate bias stripline 6 to ground as a gate bias circuit of the first GaAs FET 14. Detection resistors ($R_{Di}$) 17a and 17b, and capacitors 19a and 19b connect respective ends of the output detection section stripline 15 to ground. A diode 16 connects one end of the output detection section stripline 15 to the resistor 17b. At the side of the output detection stripline 15 to which the resistor 17b and the capacitor 19b are connected; a second field effect transistor (FET2) 18 is connected. The source of the FET 18 is connected to the gate bias terminal 4, the drain is connected to the node of the first and second gate bias resistors 11 and 12, and the gate is connected to the node of the diode 16 and the resistor 17b.

The respective circuit elements are connected as described in the above and as shown in FIG. 1 and operate as described in detail as follows.

A drain bias voltage is applied to the first FET 14 from the drain bias terminal 3 through the drain bias stripline 7 and a gate bias voltage is applied to the first FET 14 from the gate bias terminal 4 through the second FET 18, the gate bias resistors 11 and 12, and the gate bias stripline 6. In this state, when a high frequency signal is input to the amplifier from the input terminal 1, an amplified signal is supplied at the output terminal 2.

The operation of the gate bias control circuit, in the present invention will be described.

An output signal level $P_{out}$, a DC voltage, can be obtained at the terminal of the detection resistor 17b connected to the output detection section stripline 15, the output detection diode 16, and the output detection resistors 17a and 17b. By applying this voltage to the gate of the second FET 18 as $V_{GS2}$, the source to drain current $I_{D2}$ of the FET 18 can be controlled.

That is, because the current $I_{Di}$ flowing through the detection resistor $R_{Di}$ 17b is represented by $$I_{Di}=k_1 \cdot P_{out}$$

(herein, $k_1$ is a constant) the gate voltage $V_{GS2}$ applied to the second FET 18 is represented by $$V_{GS2}=(K_1' \cdot P_{out}-|V_1|)$$

(herein, $k_1'$ is a constant, $V_1$ is a detection bias voltage; $V_1<0$)
and accordingly, the source to drain current $I_{D2}$ of the FET 18 is represented by $$I_{D2}=-k_2(k_1' \cdot P_{out}-|V_1|)+A$$

(herein, $k_2$, A are constants).
Furthermore, suppose that the resistance of the second gate bias resistor 12 is $R_{G2}$, the gate bias voltage $V_{GS1}$ applied to the gate of the first FET 14 is represented by $$V_{GS1}=-R_{G2}(A-k_2 \cdot k_1 \cdot P_{out}+k_2|V_1|).$$

That is, $$V_{GS1}=-R_{G2} \times I_{D2},$$

and accordingly, when the output signal level $P_{out}$ is low, the applied gate voltage $V_{GS1}$ of FET 14 is lowered and the source to drain current $I_D$ is also reduced. In other words, even when the output signal level $P_{out}$ is low, the source to drain current $I_D$ of the main amplification FET 14 can be reduced, thereby enabling high efficiency.

Figure 2:
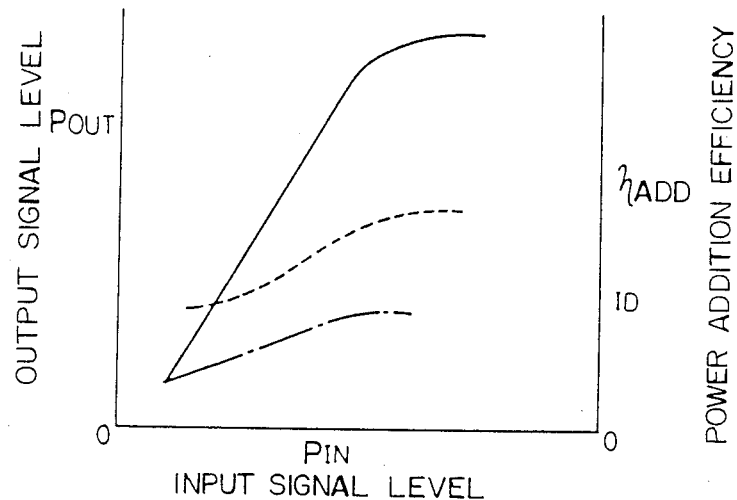
FIG. 2 is a diagram showing the input/output characteristic of the high frequency amplifier of FIG. 1.
Figure 3:
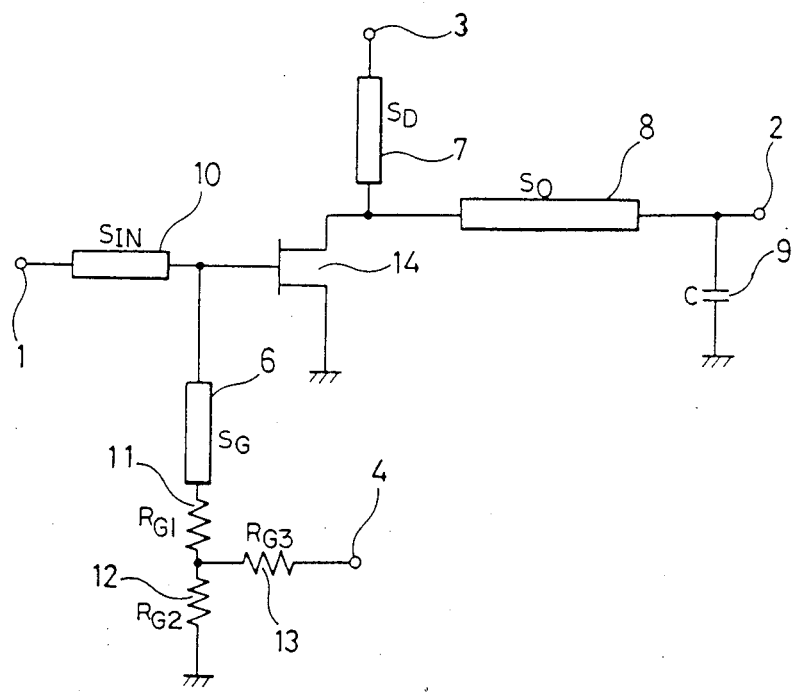
FIG. 3 is a diagram showing a prior art high frequency amplifier.
Figure 4:
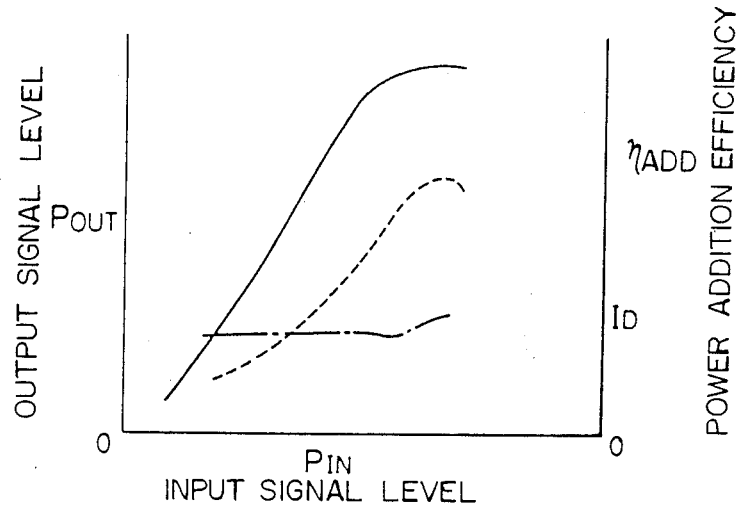
FIG. 4 is diagram showing the input/output characteristic of the prior art high frequency amplifier.
Figure 5:
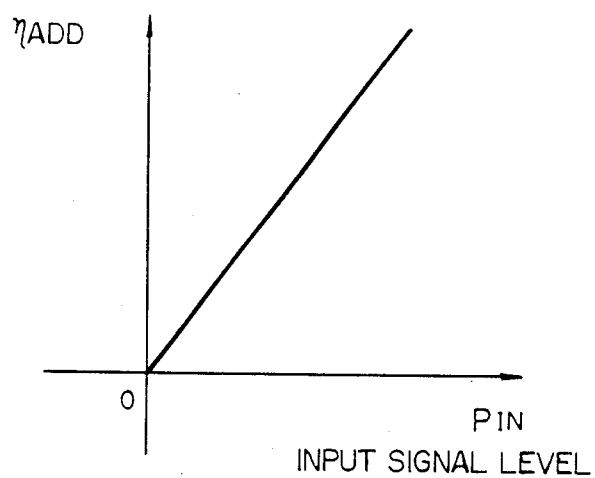
FIG. 5 is a diagram showing the input signal level $P_{in}$ vs. power added efficiency, $\eta_{add}$, characteristic at a low input signal level of the prior art high frequency amplifier.

FIG. 2 shows an input/output characteristic for the operation of the high frequency amplifier according to the present invention. The manner of representation of this input/output characteristic is the same as that shown in FIG. 4. The solid line represents the input signal level $P_{in}$ vs. output signal level $P_{out}$ characteristic, the dotted line represents the input signal level $P_{in}$ vs. power addition efficiency $\eta_{add}$ characteristic, and the dot-dash line represents the input signal level $P_{in}$ vs. drain current $I_D$ characteristic, respectively, of FET 14. As is apparent from the comparison between FIGS. 2 and 4, high efficiency can be obtained even at a low input signal level, according to FIG. 2 of the present invention.

As discussed above, a circuit for detecting the output signals, comprising, for example, an output detection section stripline 15, a detection diode 16, detection resistors 17a and 17b, is provided, and further, an FET 18 whose gate is connected to the detection output is provided in the gate bias circuit of the main amplification FET 14, whereby an output feedback circuit for feeding back the output signal to the gate bias circuit of the main amplification FET 14 is provided. Therefore, when the output signal level is lowered, the drain current of the FET 18 in the output feedback circuit is increased, and the gate bias of the FET 14 is decreased, thereby reducing the source to drain current. This enables high efficiency in operation even at a low input signal level. Furthermore, the output detection section circuit and the gate bias control circuit can be easily fabricated in the neighborhood of the main amplification FET 14, and enabling fabrication of the high frequency amplifier as a hybrid integrated circuit.

As is evident from the foregoing description, according to the present invention, there are provided an output signal level detection section for detecting the level of the amplified output signal and a gate bias control circuit for controlling the gate bias voltage of the main amplification FET by feed backing the detected output signal level. Therefore, the source to drain current of the main amplification FET can be reduced when the input signal level is low, thereby enabling high frequency, high efficiency amplification even at a low input signal level. Further, the output level detection section circuit and the gate bias control circuit can be easily fabricated in the neighborhood of the main amplification FET, thereby enabling fabrication as a high frequency hybrid integrated circuit.

What is claimed is:

1. A high frequency amplifier including:
   a first field effect transistor for amplifying a first input signal and producing an amplified output signal;
   an output detection section stripline having first and second ends for detecting the level of the amplified output signal;
   a series connected first resistor and diode connected between the first end of said output detection section stripline and ground; and
   a second field effect transistor connected to the connection of said first resistor and diode to receive as a second input signal the signal at said node and to produce, in response thereto, a second output signal for biasing said first field effect transistor.

2. A high frequency amplifier as defined in claim 1 including an output section stripline for transmitting the amplified output signal wherein said output detection section stripline is disposed parallel to said output section stripline.

3. A high frequency amplifier as defined in claim 1 including a first capacitor connected in series between said first resistor and ground, and a second resistor and a second capacitor connected in series between the second end of said output detection stripline and ground.

4. A high frequency amplifier as defined in claim 3 wherein said second field effect transistor includes a gate for receiving an input signal and the connection of said first resistor and diode is connected to the gate of said second field effect transistor.

5. An amplifier employing stripline circuitry comprising:
   a first field effect transistor including source, gate, and drain electrodes for amplifying an input signal applied to said gate electrode and for producing an amplified output signal at said drain electrode;
   input and output striplines connected to the gate and drain electrodes of said first field effect transistor for transmitting the input signal to and the output signal from said first field effect transistor, respectively;
   a gate biasing network having a gate biasing terminal for supplying a gate biasing signal to the gate electrode of said first field effect transistor;
   a detection stripline proximate said output stripline for producing a feedback signal indicative of the amplitude of the output signal; and
   feedback means for rectifying the feedback signal and supplying the rectified feedback signal to the gate biasing network to control the direct current component of the output signal in response to the amplitude of the output signal.

6. The amplifier of claim 5 wherein the detection stripline includes first and second terminals and said feedback means includes a rectifier connected from the first terminal to ground for rectifying the feedback signal, a second field effect transistor having source, gate, and drain electrodes, the gate electrode of the second field effect transistor receiving the rectified feedback signal and one of the drain and source electrodes of the second field effect transistor supplying the rectified feedback signal to the gate biasing network.

7. The amplifier of claim 6 wherein the first terminal is connected to ground through the rectifier, a resistor, and a capacitor, all serially connected, and the second terminal is connected to ground through a serially connected resistor and capacitor.

8. The amplifier of claim 6 wherein the gate biasing network includes a biasing stripline and two biasing resistors serially connected from the gate electrode to the first field effect transistor to ground and the electrode of the second field effect transistor supplying the rectified feedback signal is connected to the junction of the two biasing resistors.

9. The amplifier of claim 5 wherein the detection stripline is disposed parallel to and proximate the output stripline for coupling the striplines to each other and producing the feedback signal.

* * * * *

UNITED STATES PATENT AND TRADEMARK OFFICE
CERTIFICATE OF CORRECTION

PATENT NO. : 4,987,384

DATED : January 22, 1991

INVENTOR(S) : Yamanouchi et al.

It is certified that error appears in the above-identified patent and that said Letters Patent is hereby corrected as shown below:

Column 5, lines 10-11, change "connection" to --node--;
   "    , line 29, change "connection" to --node--.

Signed and Sealed this

Eighth Day of September, 1992

Attest:

DOUGLAS B. COMER

Attesting Officer    Acting Commissioner of Patents and Trademarks